March 9, 1965 K. HINRICHS ETAL 3,173,096
CLAMPING CIRCUITS FOR LIMITING THE OUTPUT OF AN AMPLIFIER
Filed May 2, 1962

INVENTORS
KARL HINRICHS
BARRET B. WEEKES
BY Samuel B. Stone
ATTORNEY

United States Patent Office 3,173,096

Patented Mar. 9, 1965

3,173,096

CLAMPING CIRCUITS FOR LIMITING THE OUTPUT OF AN AMPLIFIER

Karl Hinrichs, Fullerton, and Barret B. Weekes, Newport Beach, Calif., assignors to Beckman Instruments, Inc., a corporation of California Filed May 2, 1962, Ser. No. 191,915
9 Claims. (Cl. 330—3)

Figure 1:
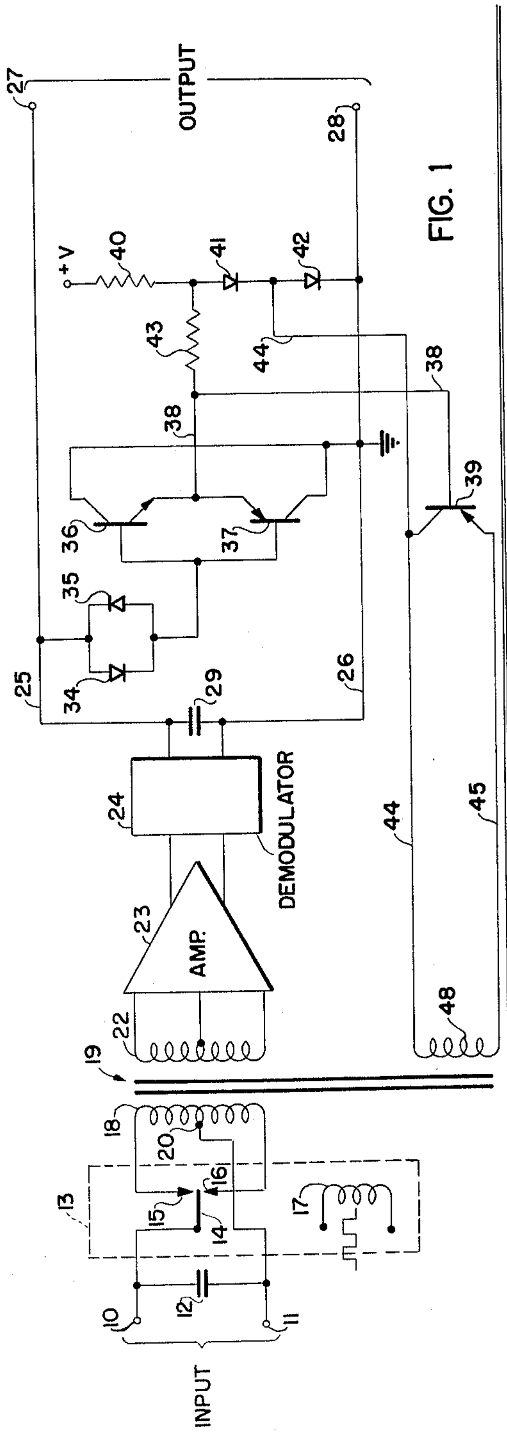

The present invention relates to clamping circuits and more particularly to dynamic clamping circuits utilized to prevent saturation and limit the output voltage of an amplifier.

High accuracy amplifiers are required for certain applications, for example, low level measurements. It is necessary that such amplifiers have highly accurate linearity and gain over a wide bandwidth, and be fast in operation while providing virtually complete conductive and electrostatic isolation between the input and the output of the amplifier. Signals to be amplified may include D.C., very low frequency A.C., and high frequency A.C. components. The D.C. and very low frequency A.C. components may be amplified by utilizing carrier modulation. For example, an error signal (the difference between an input signal and a feedback signal) is modulated, transferred through a transformer, amplified by a carrier amplifier and then demodulated. Occasionally, the error signal is large and the carrier amplifier becomes saturated, whereby the accuracy of the over-all amplifier is diminished and its settling time is increased.

Accordingly, it is a feature of the present invention to provide a clamping circuit to prevent saturation in a transformer-coupled amplifier and to limit the output voltage thereof.

A further feature of the present invention is to provide a clamping circuit for a transformer-coupled amplifier whereby the clamping circuit places a floating short-circuit on the transformer upon over-load of the amplifier.

Another feature of the present invention is the provision of a clamping circuit connected with the output of a transformer-coupled carrier amplifier wherein the clamping circuit senses voltages overloads to prevent saturation of the amplifier and to limit output voltage.

In the one embodiment according to the present invention, a clamping circuit is connected across the output terminals of a transformer-coupled amplifier. A pair of reversely poled unilaterally conductive devices, or in some instances only a conductive line, is connected from one output terminal of the transformer-coupled amplifier to first electrodes of a pair of opposite conductivity type transistors. Second electrodes of the transistors are connected to the other output terminal of the transformer-coupled amplifier. Third electrodes of the transistors are connected together and connected to a first electrode of a third transistor. The remaining electrodes of the third transistor are connected across a second secondary winding, or tertiary winding, on the transformer. Normally, the third transistor is not conducting and provides a high impedance shunt across the tertiary winding. When the output voltage of the amplifier exceeds a predetermined magnitude, one of the unilaterally conductive devices and one of the first two transistors conduct, thereby turning on the third transistor. When the third transistor is turned on, it provides a low impedance shunt across the tertiary winding of the transformer. Consequently, the secondary voltage of the transformer is reduced thereby reducing the output voltage of the amplifier.

In another embodiment of the present invention, a pair of unilaterally conductive devices may be connected from one output terminal of the transformer-coupled amplifier to respective first electrodes of opposite conductivity type transistors. Second eletcrodes of the transistors are connected together and to the other output terminal of the amplifier and to one end of the tertiary winding on the transformer. Third electrodes of the transistors are connected together and to the other end of the tertiary winding. Normally, both transistors are not conducting and provide a high impedance shunt across the tertiary winding. When the output voltage of the amplifier exceeds a predetermined magnitude, one of the transistors turns on, thereby providing a low impedance shunt across the tertiary winding. When a low impedance shunt exists across the tertiary winding, the voltage on the secondary of the transformer is reduced thereby reducing the output voltage of the amplifier.

Figure 2:
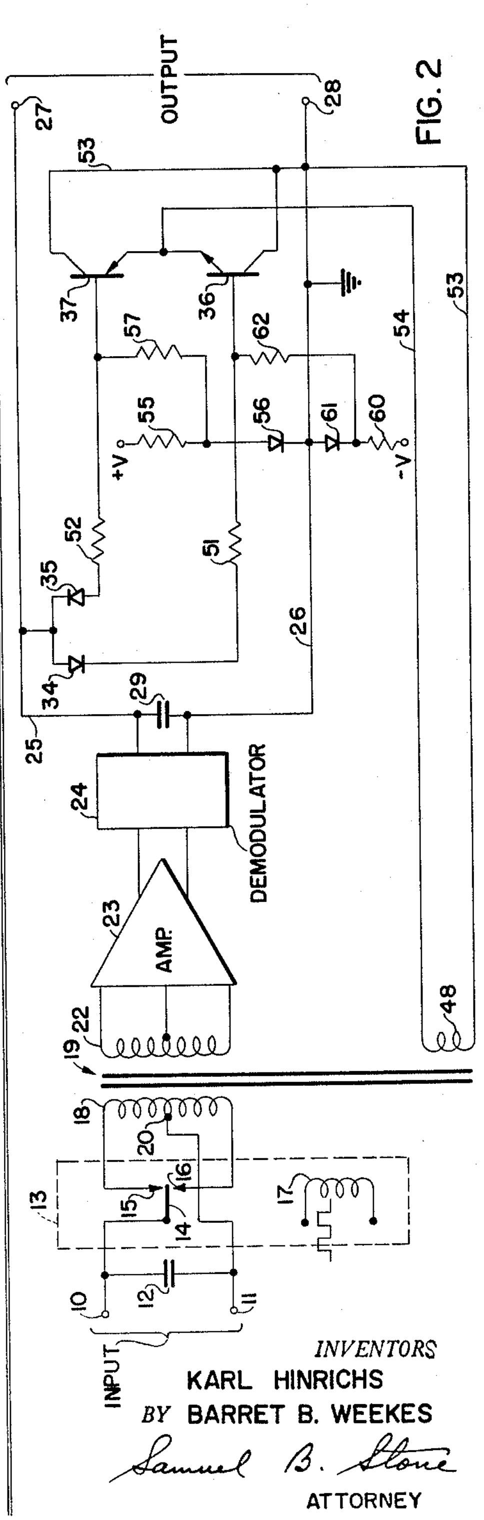

Other features and objects of the invention will be better understood from a consideration of the following detailed description when read in conjunction with the attached drawing in which:

FIG. 1 is a schematic diagram of a clamping circuit constructed in accordance with the teachings of the present invention; and FIG. 2 illustrates an alternative clamping circuit constructed in accordance with the present invention.

FIG. 1 illustrates a low-pass amplifier, and a clamping circuit constructed in accordance with the present invention connected with the output thereof. The low-pass amplifier may be similar to that described in copending U.S. patent application Serial No. 823,796, filed April 27, 1959, now patent No. 3,130,373, entitled "Potential Difference Transfer Device," and assigned to the assignee of the present invention. This copending application describes an ultralinear, high accuracy amplifier for amplifying signals having a frequency range from direct current to a relatively low alternating current frequency. In the above copending appliaction, a feedback circuit is provided from the output of the amplifier to the input thereof, but this feedback arrangement is not illustrated in FIG. 1 since it is not necessary for an understanding of the present invention. Furthermore, the amplifier illustrated in FIG. 1 may be similar to the amplifier described in copending U.S. patent application Serial No. 151,604, filed November 13, 1961, entitled "Wide-Band Amplifier," which is assigned to the assignee of the present invention and includes an arrangement for transferring high frequency signals, an arrangement for transferring low frequency signals similar to that shown in FIG. 1, and a feedback circuit for the over-all amplifier.

In FIG. 1, an input signal, which usually is an error signal resulting from the difference between an input transducer signal and a feedback signal where a feedback circuit is utilized, is applied to input terminals 10 and 11. A capacitor 12 is connected across the input terminals 10 and 11, and these terminals are connected to a modulator 13. The modulator 13 may be a conventional contact modulator which includes a vibrating contact arm 14, and fixed contacts 15 and 16. The modulator 13 also includes a winding 17 which controls the vibratory movement of the arm 14. The output of the modulator 13 is connected to a primary winding 18 of a transformer 19. The input terminal 10 is connected to the vibratory contact arm 14, and the input terminal 11 is connected to a center tap 20 on the primary winding 18. The fixed contacts 15 and 16 are connected across the primary winding 18.

The transformer 19 includes a secondary winding 22 which is connected to the input of an A.C. amplifier 23. The output of the amplifier 23 is connected to a demodulator 24. The output of the demodulator 24 is connected through lines 25 and 26 respectively to output terminals 27 and 28. A capacitor 29 is connected across the output of the demodulator 24.

The arrangement thus far described is a low-pass amplifier which is well known to those skilled in the art.

The amplifier functions to amplify D.C. and low frequency A.C. signals. The signals applied to the input terminals 10 and 11 are modulated by the modulator 13 and transferred through the transformer 19 to the amplifier 23. The transformer 19 provides conductive and electrostatic isolation between the input and the output of the over-all amplifier. The output signals from the amplifier 23 are demodulated by the demodulator 24 and applied to the output terminals 27 and 28.

In operation, the amplifier 23 may become saturated. In the past it has been conventional merely to connect diodes across the output of the amplifier 23, across the input terminals 10 and 11, or across the output of the demodulator 24 to limit the output voltage of the amplifier.

According to a feature of the present invention, a dynamic clamping circuit is connected with the output of a transformer coupled amplifier to prevent saturation therein and to limit the output voltage. The clamping circuit includes oppositely poled diodes 34 and 35 which are connected from the output line 25 to the bases of respective NPN and PNP transistors 36 and 37. The collectors of the transistors 36 and 37 are connected together and to the output line 26 which may be grounded as shown. The emitters of the transistors 36 and 37 are connected together and through a line 38 to the base of a PNP transistor 39. A positive potential source (not shown) is connected through a resistance 40, a diode 41, and a diode 42 to the output line 26. The emitters of the transistors 36 and 37 are connected through the line 38 and a resistance 43 to the junction of the resistance 40 and the diode 41. The junction of the diodes 41 and 42 is connected through a line 44 to the collector of the transistor 39. The transistor 39 is connected through lines 44 and 45 across a tertiary winding 48 on the transformer 19. The turns ratio of the primary winding 18 to each of the windings 22 and 48 may be a one-to-one ratio, if desired.

According to another feature of the present invention, the transistor 39 short circuits the tertiary winding 48 when the input voltage supplied to the input terminals 10 and 11 exceeds a desired magnitude. Consider $E_1$ as the input voltage applied to the input terminals 10 and 11, $E_o'$ as the forward conduction breakdown voltage of the diodes 34 and 35, and the base-to-collector diodes of the transistors 36 and 37, and A as the combined voltage gain of the transformer 19, the amplifier 23 and the demodulator 24. If the input voltage $E_1$ exceeds a desired input voltage, $$\frac{E_o'}{A}$$

one of the two transistors 36 and 37 conducts and turns on the transistor 39. That is, depending upon the polarity of the voltage across the lines 25 and 26, one of the diodes 34 or 35 conducts and, therefore, one of the transistors 36 or 37 conducts (since one transistor is a PNP transistor and the other transistor is an NPN transistor). When one of the transistors 36 or 37 turns on, the base of the transistor 39 is biased so that the transistor 39 turns on and becomes saturated. When the transistor 39 becomes saturated, the tertiary winding 48 is shunted by the impedance of the transistor 39. When the tertiary winding 48 is shunted, the input voltage applied to the amplifier 23 is decreased. That is, when a low impedance shunt is placed across the tertiary winding 48, it effectively operates as a low impedance shunt across the secondary winding 22 thereby reducing the voltage across this latter winding. Consequently, the voltage applied to the amplifier 23 by the secondary winding 22 is reduced.

If the forward conduction breakdown voltage, $E_o'$, of the diodes 34 and 35 and the transistors 36 and 37 is greater than the voltage across the lines 25 and 26, neither the transistor 36 nor the transistor 37 conducts.

When both the transistors 36 and 37 are non-conducting, the transistor 39 is biased off to maintain the shunt impedance on the tertiary winding 48 at a high value, such as 100,000 ohms or greater (the open circuit impedance of the transistor 39). Hence, the network including the resistances 40 and 43 and the diodes 41 and 42 serves as a biasing network for the transistor 39. The diodes 41 and 42 function to provide turn-off and turn-on bias voltages, respectively, for the transistor 39. The operation of the clamping circuit is not proportional to the overload, but is an on-off type operation. The diodes 34, 35, and 41 and 42 may be silicon diodes and the transistors 36, 37 and 39 may be germanium transistors, if desired.

It should be noted that the diodes 34 and 35 function to increase the threshold turn-on voltage of the transistors 36 and 37. Since there is a particular forward breakdown voltage between the base-to-collector diodes of the transistors 36 and 37, this breakdown voltage alone may be sufficiently high in many applications. In this case the diodes 34 and 35 may be eliminated and the bases of the transistors 36 and 37 directly connected to the line 25.

FIG. 2 illustrates an alternative clamping arrangement for an amplifier. Components which are the same as those illustrated in FIG. 1 are denoted by like reference numerals. The same low-pass amplifier is illustrated in FIG. 2 as is illustrated in FIG. 1, only the clamping circuit being different. The signal applied to the input terminals 10 and 11 is modulated by the modulator 13 and transferred through the transformer 19 to the amplifier 23 as discussed in connection with FIG. 1. The output of the amplifier 23 is demodulated by the demodulator 24 and applied through the lines 25 and 26 to the respective output terminals 27 and 28. The clamping circuit includes diodes 34 and 35 connected from the line 25 respectively through resistances 51 and 52 to the bases of the transistors 36 and 37, respectively. The collectors of the transistors 36 and 37 are connected through a line 53 to the line 26 which is grounded. The emitters of the transistors 36 and 37 are connected together and to a line 54. The lines 53 and 54 are connected to the tertiary winding 48 of the transformer 19.

A positive potential source (not shown) is connected through a resistance 55 and a diode 56 to the line 26. The junction of the resistance 55 and the diode 56 is connected through a resistance 57 to the base of the transistor 37. A negative potential source (not shown) is connected through a resistance 60 and a diode 61 to the line 26. The junction of the resistance 60 and the diode 61 is connected through a resistance 62 to the base of the transistor 36. The positive potential source, the resistances 55 and 57 and the diode 56 provide the turn-off bias voltage for the base of the transistor 37; the negative potential source, the resistances 60 and 62 and the diode 61 provide the turn-off bias voltage for the base of the transistor 36.

According to a feature of this invention, when the potential across the input terminals 10 and 11 and, consequently, the potential difference across the output lines 25 and 26 exceeds a predetermined magnitude, one of the transistors 36 or 37 is turned on. If the potential difference across the output lines 25 and 26 is positive (the line 25 positive with respect to the line 26), and exceeds the forward voltage drop of the diode 34 plus the collector to base voltage drop or the transistor 36, the transistor 36 is turned on. If the potential difference across the lines 25 and 26 is negative and exceeds the forward voltage drop of the diode 35 plus the collector to base voltage drop of the transistor 37, the transistor 37 is turned on. According to a further feature of the present invention, when either the transistor 36 or the transistor 37 is turned on, a low impedance shunt exists across the tertiary winding 48 which in turn limits the input signal to the amplifier 23. As discussed previously, a low impedance shunt across the tertiary winding 48 causes the voltage on the secondary winding 22 to drop thereby reducing the input voltage to the amplifier 23.

If the voltage between the lines 25 and 26 is below the forward voltage drop of the diodes 34 and 35 and the transistors 36 and 37, both the transistors 36 and 37 remain off because they are reversed-biased respectively by diodes 61 and 56, and the resistances 62 and 57, respectively. Thus, the potential across the terminals 25 and 26 overrides the bias applied to the bases of the transistors 36 and 37 when this potential exceeds the forward voltage drop of one of the diodes 34 or 35 and one of the respective transistors 36 or 37.

The clamping circuit shown in FIG. 2 may be preferable because it employs fewer transistors than the clamping circuit in FIG. 1. However, the clamping circuit in FIG. 2 requires a slightly greater current from the demodulator 24 for operation.

It now should be apparent that the present invention provides clamping circuits for transformer-coupled amplifiers, whereby saturation of the amplifier is prevented and its output voltage is limited by applying a shunt across a tertiary winding on the transformer. The clamping circuits respond to output voltages (or either polarity) above a predetermined magnitude and provide a low impedance shunt across the tertiary winding. When the tertiary winding is shunted by a low impedance, the voltage transferred by the transformer is reduced thereby preventing saturation in the amplifier and limiting its output voltage. Such an arrangement may be utilized with amplifiers having different band pass characteristics, if desired.

Although exemplary embodiments of the present invention have been disclosed and discussed, other applications and circuit arrangements are possible and the embodiments disclosed may be subjected to various changes, modifications and substitutions without necessarily departing from the spirit of the invention.

What is claimed is:

1. A potential transfer device including a transformer having a primary winding and a secondary winding, first modulator means for applying input signals to said primary winding, an amplifier having input terminals connected with said secondary winding and having output terminals, second demodulator means coupling said output of said amplifier to circuit output terminals, the improvement comprising
   - a clamping circuit connected with said circuit output terminals.
   - a second secondary winding coupled with said transformer, and
   - third means having a sharp threshold coupling said clamping circuit with said second secondary winding whereby said clamping circuit provides a low impedance shunt across said second secondary winding when the voltage across said circuit output terminals exceeds a predetermined magnitude.

2. A potential transfer device as in claim 1 wherein
   - said clamping circuit includes a pair of oppositely poled diodes, and
   - a pair of opposite conductivity type transistors having their respective bases, emitters and collectors directly connected, said diodes being connected from one output terminal of said amplifier to the bases of said transistors, the collectors of said transistors being connected to a second output terminal of said amplifier, and said emitters of said transistors being connected to said third means.

3. A potential transfer device as in claim 2 wherein
   - said third means includes a transistor having its base connected with the emitters of said opposite conductivity type transistors, and its emitter and collector connected across said second secondary winding.

4. A circuit for transferring signals from input terminals to output terminals including a transformer having a primary winding and a secondary winding, first modulator means connecting said input terminals to said primary winding, second series connected amplifier and demodulator means connecting said secondary winding with said output terminals, the improvement comprising
   - a pair of oppositely poled unilaterally conductive semiconductive devices having oppositely poled sides connected with one of said output terminals,
   - a pair of opposite conductivity type transistors having the same first, second and third electrodes, the first electrodes each being connected with at least one of the sides of said diodes not connected to said one input terminal and the second electrodes being connected with the other of said output terminals,
   - a tertiary winding on said transformer, and
   - third means connecting said transistors with said tertiary winding to provide a low impedance shunt across said tertiary winding when the voltage across said output terminals exceeds a predetermined value.

5. A circuit as in claim 4 wherein
   - said third means comprises a transistor having a first electrode connected with the third electrodes of said opposite conductivity type transistors and having second and third electrodes connected across said tertiary winding.

6. A device as in claim 4 wherein said third means includes conductive connections from the second and third electrodes of said opposite conductivity type transistors to said tertiary winding.

7. In a potential transfer device having input terminals and output terminals, a transformer having a primary winding and a secondary winding, first means connecting said input terminals with said primary winding, an amplifier having an input and an output, the input of said amplifier being connected with said secondary winding, second means connecting the output of said amplifier with said output terminals, the improvement comprising,
   - unilaterally conductive means connected with one of said output terminals,
   - a pair of opposite conductivity type transistors having their respective bases, emitters and collectors directly connected,
   - third means connecting said unilaterally conductive means with the bases of said transistors,
   - fourth means connecting the collectors of said transistors with the other of said output terminals,
   - a second secondary winding on said transformer, and
   - means connecting said other output terminal and the emitters of said transistors across said second secondary winding whereby one of said transistors provides a low impedance shunt across said second secondary winding when the voltage across said output terminals exceeds a predetermined magnitude.

8. In a potential transfer device having input terminals and output terminals, a transformer having a primary winding and a secondary winding, first means connecting said input terminals with said primary winding, an amplifier having an input and an output, the input of said amplifier being connected with said secondary winding, second means connecting the output of said amplifier with said output terminals, the improvement comprising,
   - unilaterally conductive means connected with one of said output terminals,
   - a pair of opposite conductivity type transistors having their respective bases, emitters and collectors directly connected,
   - third means connecting said unilaterally conductive means with the bases of said transistors,
   - fourth means connecting the collectors of said transistors with the other of said output terminals,
   - a second secondary winding on said transformer,
   - a third transistor having three electrodes, two of which are connected across said second secondary winding, and
   - means connecting a different two of the electrodes of said third transistor with the emitters and collectors of said pair of transistors whereby said third transistor provide a low impedance shunt across said second secondary winding when the voltage across said output terminals exceeds a predetermined magnitude.

9. A circuit for transferring signals from input terminals to output terminals including a transformer having a primary winding and a secondary winding, first means connecting said input terminals to said primary winding, an amplifier having an input and an output, the input of said amplifier being connected with said secondary winding, second means connecting the output of said amplifier with said output terminals, the improvement comprising a pair of opposite conductivity type semiconductive devices having three electrodes, the first and second respective electrodes of each semiconductive device being connected together, third means connecting the third electrodes of each of said semiconductive devices to one of said output terminals, and said first electrodes of each of said semiconductive devices being connected to the other of said output terminals, a second secondary winding on said transformer, and fourth means connecting said first and second electrodes of said semiconductive devices across said second secondary winding to provide a low impedance shunt across said second secondary winding when the voltage across said output terminals exceeds a predetermined value.

References Cited in the file of this patent

UNITED STATES PATENTS

| | | |
|---|---|---|
| 2,152,618 | Wheeler | Mar. 28, 1939 |
| 2,719,191 | Hermes | Sept. 27, 1955 |
| 3,102,924 | Legler | Sept. 3, 1963 |